United States Patent [19]

Martens

[11] Patent Number: 5,751,727
[45] Date of Patent: May 12, 1998

[54] DYNAMIC LATCH CIRCUIT FOR UTILIZATION WITH HIGH-SPEED MEMORY ARRAYS

[75] Inventor: David James Martens, Austin, Tex.

[73] Assignee: International Business Machines Corporation, Armonk, N.Y.

[21] Appl. No.: 821,155

[22] Filed: Mar. 20, 1997

[51] Int. Cl.⁶ ............................................. G06F 11/00
[52] U.S. Cl. ................................. 371/21.1; 365/201
[58] Field of Search ......................... 371/21.1; 365/201, 365/182, 226

[56] References Cited

U.S. PATENT DOCUMENTS

| | | | |
|---|---|---|---|
| 4,972,377 | 11/1990 | Lee | 365/226 |
| 5,051,951 | 9/1991 | Maly et al. | 365/150 |
| 5,130,568 | 7/1992 | Miller et al. | 307/272.2 |
| 5,191,554 | 3/1993 | Lee | 365/226 |
| 5,361,232 | 11/1994 | Petschauer et al. | 365/201 |
| 5,528,601 | 6/1996 | Schmookler | 371/22.3 |

*Primary Examiner*—Vincent P. Canney
*Attorney, Agent, or Firm*—Anthony V. S. England; Kermit D. Lopez; Andrew J. Dillon

[57] ABSTRACT

A dynamic scannable latch circuit for high-speed memory arrays utilized in high-performance integrated circuit devices, wherein the high-speed memory arrays include data-bearing bitlines. The dynamic scannable latch circuit includes a group of scannable latch circuits for serially reading data from high-speed memory arrays during memory-testing cycles wherein each scannable latch circuit provides a scan output to a scan input of a second or next scannable latch circuit in a series of scannable latch circuits. In addition, the dynamic scannable latch circuit includes sensing and combination circuits for sensing the presence of the data-bearing bitlines and for combining the data-bearing bitlines into a memory array output wherein the sensing and combination circuits are coupled to the group of scannable latch circuits. In addition, the sensing and combination circuits further include NAND circuits integrated into a front end of the dynamic scannable latch circuit. Each NAND circuit includes NAND inputs and a NAND output such that each NAND output is coupled to one of the scannable latch circuits among the group of scannable latch circuits. The integration of the NAND circuit into the front end of the dynamic scannable latch circuit reduces the number of transistors utilized to implement the necessary functions for the memory array output and contributes to minimum delay and proper testability.

6 Claims, 6 Drawing Sheets

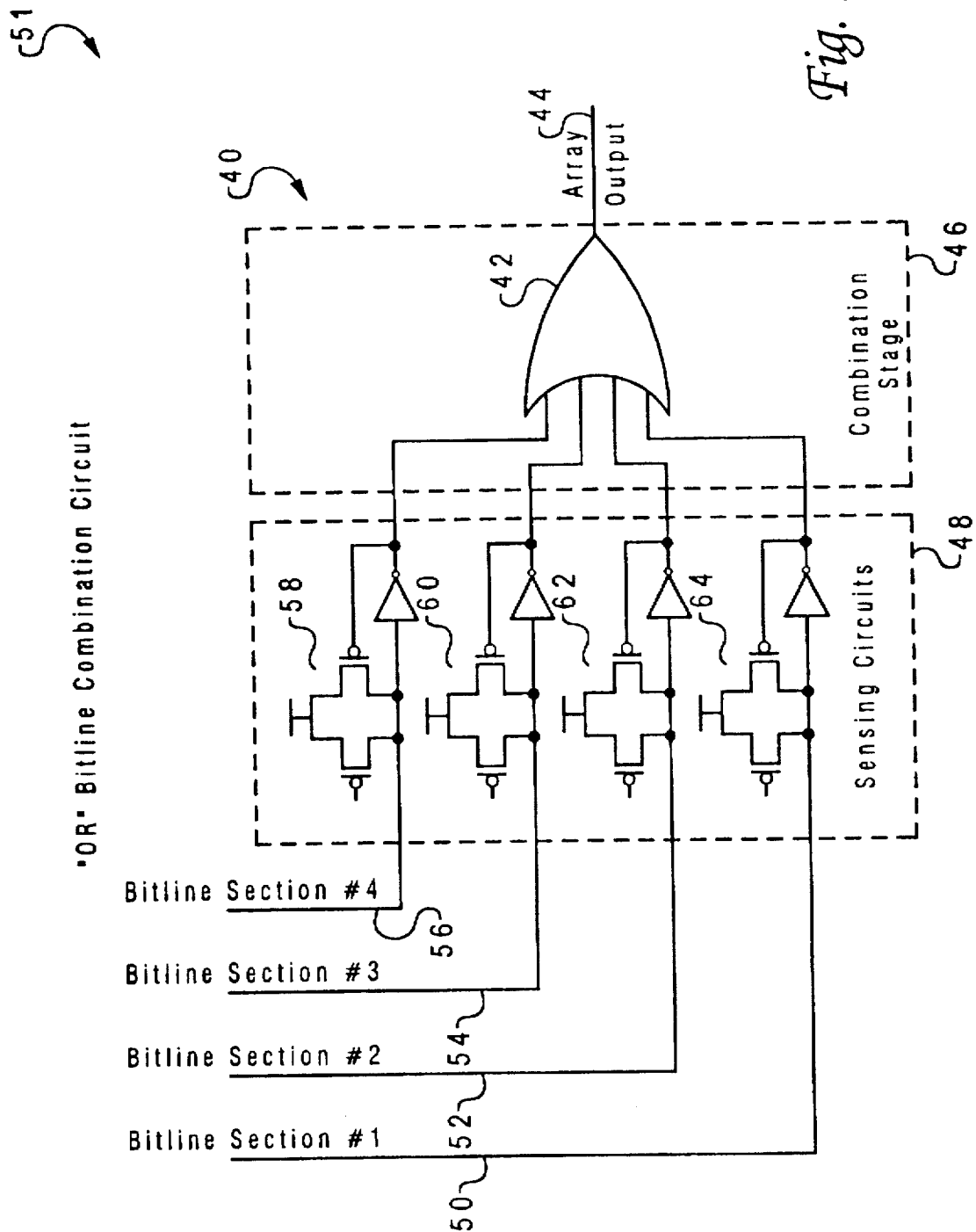

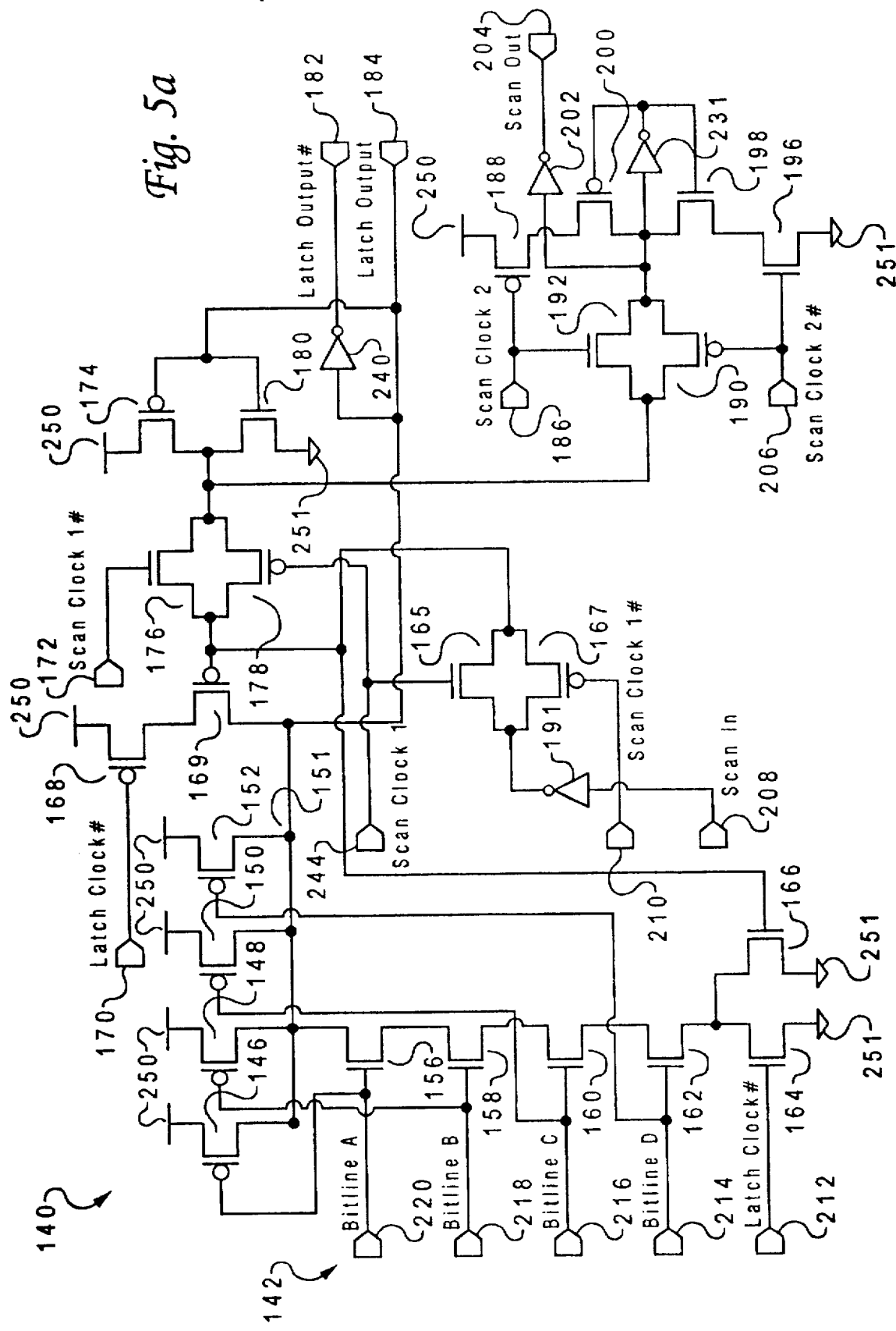
Fig. 5a  Scannable Dynamic Latch with Bitline NAND Functionality

Scannable Dynamic Latch with Bitline NAND Functionality

DYNAMIC LATCH CIRCUIT FOR UTILIZATION WITH HIGH-SPEED MEMORY ARRAYS

BACKGROUND OF THE INVENTION

1. Technical Field

The present invention relates to high-performance arrays utilized in microprocessor circuits. In particular, the present invention relates to dynamic latch circuits utilized in conjunction with high-performance arrays in microprocessor circuits. More particularly, the present invention relates to dynamic latch circuits for use in high-speed array designs which decrease circuit area and increase performance in microprocessor circuits.

2. Description of the Related Art

Arrays utilized with memory cache are typically presented with the problem of addressing inefficient memory latency. A memory cache is a special memory subsystem in which frequently used data values are duplicated for quick access. A memory cache stores the contents of frequently accessed random-access memory ("RAM") locations and the addresses where such data items are stored. When the processor references an address in memory, the memory cache checks to see whether that address is present within the cache. If the memory cache does contain the address, the data is returned to the processor; if it does not, a regular memory access occurs. Provided there is only one level of cache, main memory is usually the next level down in a computer hierarchy. Main memory satisfies the demands of caches and vector units, and serves as the input/output interface as it is the destination of input as well as the source for output. Unlike memory caches, performance of main memory emphasizes both latency and bandwidth. Generally main memory latency (which affects the cache miss penalty) is the primary concern of the memory cache, while main memory bandwidth is the primary concern of input/output and vector units. As cache blocks grow from 4–8 bytes to 64–256 bytes, main memory bandwidth becomes important to caches as well.

Memory latency is traditionally measured by utilizing two measures—access time and cycle time. Access time is the time between when a read operation is requested and when the desired data, in the form of a word, arrives. Cycle time is the minimum time between requests to memory. In the 1970s, as dynamic random-access memories ("DRAMS") grew in capacity, the cost of a package with all the necessary address lines became an issue. The solution to this problem was to multiplex the address lines, thereby cutting the number of address pins in half. DRAMS must have every row accessed within a certain time window, such as 2 milliseconds, or the information in the DRAM can be lost. This property of DRAMS is signified by the first letter in the acronym DRAM (i.e., "D" for dynamic). This requirement means that the memory system is occasionally unavailable because the system must send a signal which informs every chip to refresh. The cost of a refresh is typically a full memory access for each row of the DRAM. Since the memory matrix in a DRAM is likely to be square, the number of steps in a refresh is usually the square root of the DRAM capacity.

In contrast to DRAMS are SRAMs—the first letter in the acronym SRAM representing the term "static." The dynamic nature of DRAM circuits requires that data be written back after being read, hence the difference between the access time and the cycle time and also the need to refresh. SRAMs utilize additional circuitry per bit to prevent the information from being disturbed when read. SRAM storage is based on a logic circuit known as a "flip-flop," which retains the information stored in it as long as there is enough power to run the devices. A flip-flop, also known as a bistable multivibrator, is a circuit that changes between two possible states when a pulse is received at an input to the circuit. For example, the output of a flip-flop circuit might be high until a pulse is received at the input, at which time it "flips" to low. A second pulse "flops" the output back to high, and so on. Unlike DRAMS, there is no difference between access time and cycle time and there is no need to refresh SRAMs. In DRAM designs, the emphasis is on capacity, while SRAM designs are concerned with both capacity and speed. For memories designed in comparable technologies, the capacity of DRAMs is roughly 16 times that of SRAMs, and the cycle time of SRAMs is 8 to 16 times faster than DRAMs.

The design of high-speed arrays in modern microprocessors thus presents a series of conflicting requirements, particularly those utilized in SRAM configurations. The main goal of modern microprocessors is to read data out of such arrays within a very short access time, and with a minimum of required power. Typically, this requirement forces array designers to construct arrays with a mind towards economy of transistors in order to minimize circuit capacitance. However, the array must also be testable by the manufacturing flow, which requires the introduction of additional support circuitry into the array design. The impact of this support circuitry on the speed path is often a tradeoff between the degree of test functionality desired and the amount of extra circuitry that can be added to the critical path in the array. Of course, any circuitry that is added for this desired test functionality will add circuit area to the total cost of the design. From the perspective of circuit area, it is desirable to integrate as many of these functions as possible into a single circuit as long as this does not hurt array read performance unacceptably.

For arrays that are intended to be utilized under high-speed conditions, it is customary to implement the array bitlines with read performance as a key design criteria. Specifically, the bitlines in the array are typically split into several sections to minimize the diffusion capacitance seen by the array cell that must discharge the bitline. From the foregoing, it can be seen that a need exists for an array which can be utilized in high-speed-operating microprocessor environments. In particular, it is desirable to improve the speed of SRAM arrays utilized in high-performance integrated circuits. Thus, a circuit design that meets this goal and also satisfies minimum size, minimum delay, and proper testabilty would find a welcome place within the modern integrated circuit industry. Such an SRAM device would also dramatically reduce cost.

SUMMARY OF THE INVENTION

It is therefore an object of the invention to provide for high-performance arrays utilized in microprocessor circuits.

It is another object of the invention to provide for dynamic latch circuits utilized in conjunction with high-performance arrays in microprocessor circuits.

It is still another object of the invention to provide for dynamic latch circuits utilized in high-speed array designs which decrease circuit area and increase performance in microprocessor circuits.

The above and other objects are achieved as is now described. A dynamic scannable latch circuit for high-speed memory arrays utilized in high-performance integrated circuit devices, wherein the high-speed memory arrays include data bearing bitlines, is presented. The dynamic scannable latch circuit includes a group of scannable latch circuits for serially reading data from high-speed memory arrays during memory testing cycles wherein each scannable latch circuit provides a scan output to a scan input of a second or next scannable latch circuit in a series of scannable latch circuits. In addition, the dynamic scannable latch circuit includes sensing and combination circuits for sensing the presence of the data-bearing bitlines and for combining the data-bearing bitlines into a memory array output wherein the sensing and combination circuits are coupled to the group of scannable latch circuits. In addition, the sensing and combination circuits further include NAND circuits integrated into a front end of the dynamic scannable latch circuit. Each NAND circuit includes NAND inputs and a NAND output such that each NAND output is coupled to one of the scannable latch circuits among the group of scannable latch circuits. The integration of the NAND circuit into the front end of the dynamic scannable latch circuit reduces the number of transistors utilized to implement the necessary functions for the memory array output.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

FIG. 2 illustrates an OR bitline combination circuit in accordance with the apparatus of the present invention.

FIG. 5(a) depicts a scannable dynamic latch circuit with bitline NAND functionality in accordance with the apparatus of the present invention.

DETAILED DESCRIPTION OF PREFERRED EMBODIMENT

Figures 1A, 1B:
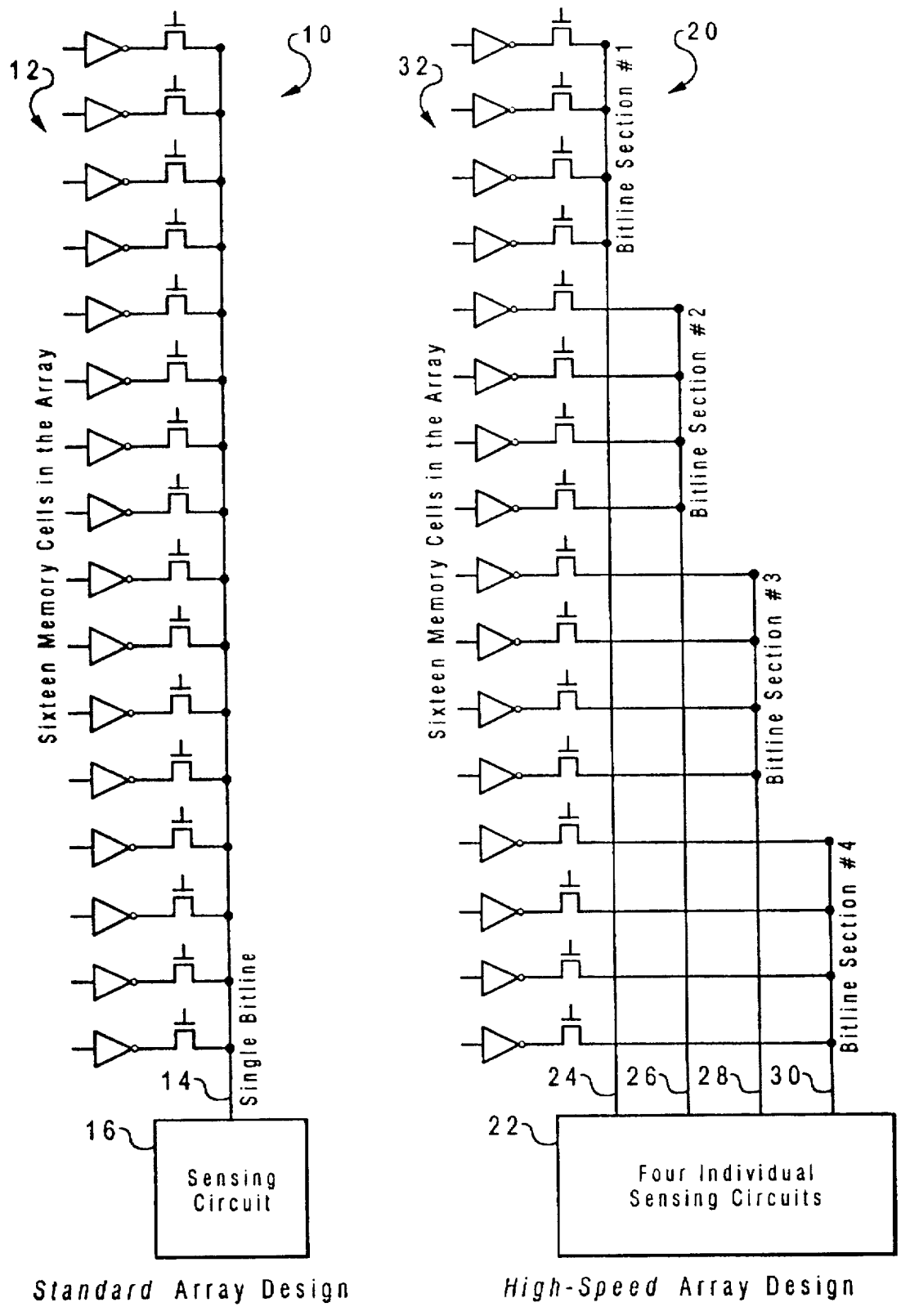
FIG. 1(a) depicts a prior art standard array design in accordance with the apparatus of the present invention.
FIG. 1(b) depicts a prior art high-speed array design in accordance with the apparatus of the present invention.

With reference now to the figures and in particular with reference to FIG. 1(a) and FIG. 1(b), there is depicted a comparison of two prior-art array designs in accordance with the apparatus of the present invention. FIG. 1(a) depicts a prior-art standard array design 10 in accordance with the apparatus of the present invention. FIG. 1(b) depicts a prior-art high-speed array design 20 in accordance with the apparatus of the present invention. For arrays that are intended to be utilized for high-speed read operations, it is customary to implement array bitlines with read performance as a key design criteria. Specifically, the bitlines in the array are typically split into several sections to minimize the diffusion capacitance seen by the array cell that must discharge the bitline. FIG. 1(a) and FIG. 1(b) present a comparison which can be drawn between "standard" array designs and high-performance implementations.

Standard array design 10 depicted in FIG. 1(a) includes a sensing circuit as depicted at block 16 which is coupled to a single bitline 14. Coupled to single bitline 14 are sixteen memory cells 12 which form an array. High-speed array design 20 depicted in FIG. 1(b) includes four individual sensing circuits as depicted at block 22. The four individual sensing circuits are respectively coupled to four bitline sections, bitline section #1 as depicted at line 24, bitline section #2 as depicted at line 26, bitline section #3 as depicted at block 28, and bitline section #4 as depicted at block 30. This is referred to as bitline splitting, wherein the single bitline as depicted in standard array design 10 is "split" into four separate bitline sections. Sixteen memory cells 32 are respectively coupled in groups of four to the respective bitline sections as depicted in FIG. 1(b).

From FIG. 1(a) and FIG. 1(b), it can be seen that high-speed designs typically split the bitlines into several (i.e., four in this particular case) parts to reduce the capacitance seen by the array cell that will be discharging the bitline. The use of such bitline splitting requires that the results from the individual bitline sections be combined into a final result as output from the array. Typically, this is accomplished using an OR functionality. Such logic may be implemented by using (1) an OR gate connected to the "true" output from the sensing circuitry, or by using (2) a NAND gate connected directly to the bitlines. In the latter example, the NAND gate can perform the function of the sensing circuitry and the combination step. It can be shown that the use of the NAND gate will reduce the number of transistors in the implementation, although the exact circuitry is dependent upon the transistor sizes chosen. Both bitline combinations are depicted in FIG. 2 and FIG. 3 respectively herein.

FIG. 2 illustrates an OR bitline combination circuit 51 which is in accordance with the apparatus of the present invention. FIG. 2 includes two principle sections, a sensing circuit section 48 and a combination stage section 46. Combination stage 46 includes a logic OR circuit 42 having an output 44 which also functions as output to the array. Sensing circuit section 48 includes four sensing circuits: sensing circuit 58, sensing circuit 60, sensing circuit 62, and sensing circuit 64. Output from each of the aforementioned sensing circuits are respectively input to logic OR circuit 42. A bitline section #1 as depicted at line 50 is input to sensing circuit 64. A bitline section #2 as depicted at line 52 is input to sensing circuit 62. A bitline section #3 as depicted at line 54 is input to sensing circuit 60. A bitline section #4 as depicted at line 56 is input to sensing circuit 58.

Figure 3:
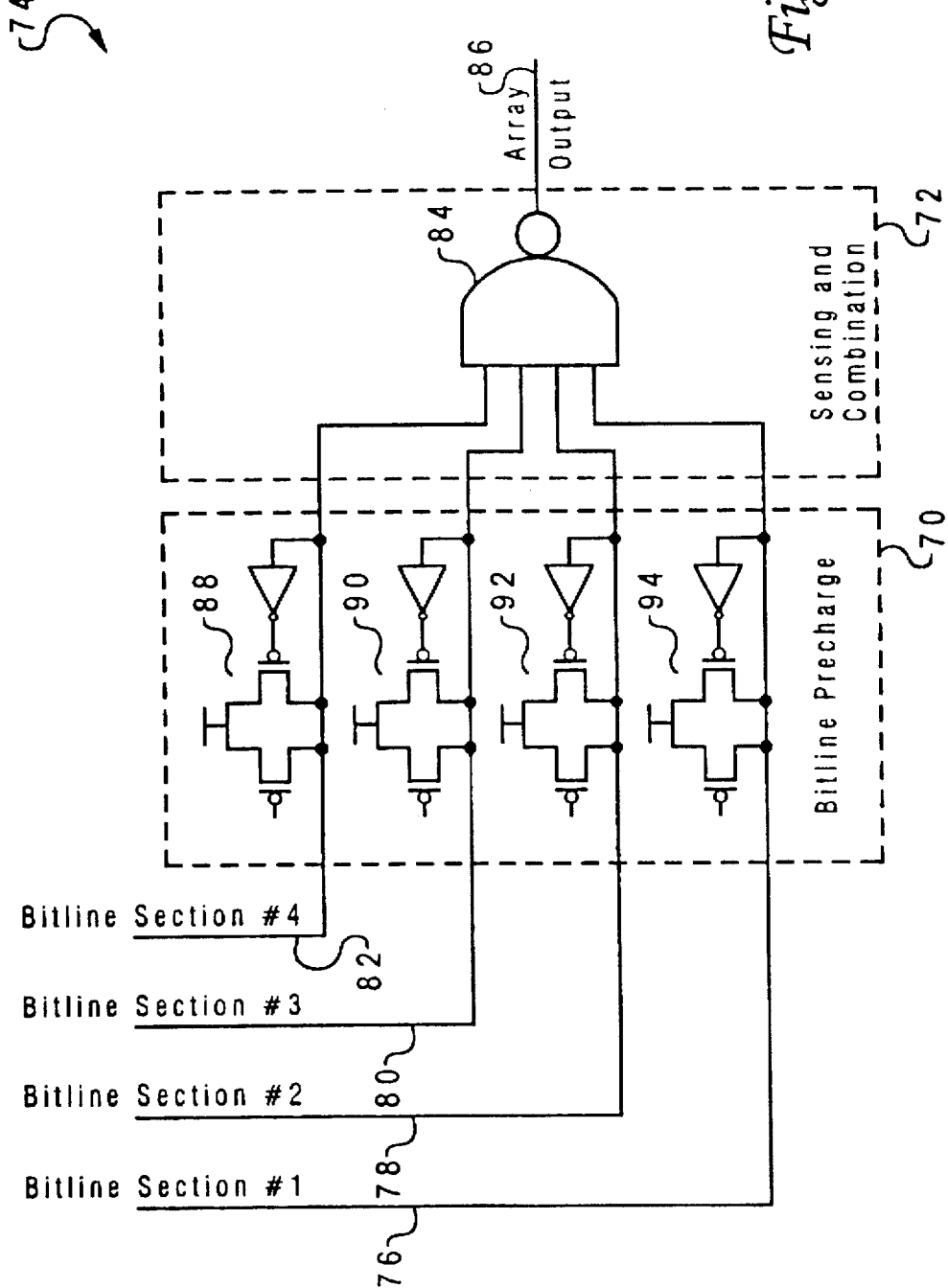
FIG. 3 depicts a NAND bitline sensing and combination circuit in accordance with the apparatus of the present invention.

FIG. 3 depicts a NAND bitline sensing and combination circuit 74 in accordance with the apparatus of the present invention. Circuit 74 includes a bitline precharge section 70 and a sensing and combination section 72. Sensing and combination section 72 includes a NAND logic circuit 84 with an output 86 which also functions as output to the array. Bitline precharge section 70 includes four bitline precharge circuits: bitline precharge circuit 94, bitline precharge circuit 92, bitline precharge circuit 90, and bitline precharge circuit 88. A bitline section #1 as depicted at line 76 is input to bitline precharge circuit 94. A bitline section #2 as depicted at line 78 is input to bitline precharge circuit 92. A bitline section #3 as depicted at line 80 is input to bitline precharge circuit 90. A bitline section #4 as depicted at line 82 is input to bitline precharge circuit 88.

Output from each of the aforementioned bitline precharge circuits are respectively input to NAND logic circuit 84. The OR and NAND implementations of the sensing and combination circuits depicted respectively in FIG. 2 and FIG. 3 each have advantages and disadvantages that must be weighed when deciding between the two alternatives. As will be depicted herein, the NAND implementation can also be integrated into a latch circuit to provide a more economical implementation of the circuitry required to provide the sensing and combination function with a latching of the output result. A latch circuit is a type of circuit utilized to maintain a particular state, such as on or off, or logical true or false. Such latch circuits change state only in response to a particular input.

In addition to reading data out of the array during normal operation of the microprocessor, it is necessary to have the capability to read data out of the array serially in certain chip-testing conditions. This capability is referred to as scannability of the array. The capability of scannability (also referred to as "scan testing") requires that the array be able to hold its results in a group of memory elements. These memory elements are connected in series such that the output from the first memory element is fed to the scan input of the second element. The output of the last memory element is fed to a test circuit outside the array for comparison to some expectation value. The relationship between memory elements and the array is depicted in FIG. 4 herein.

Figure 4:
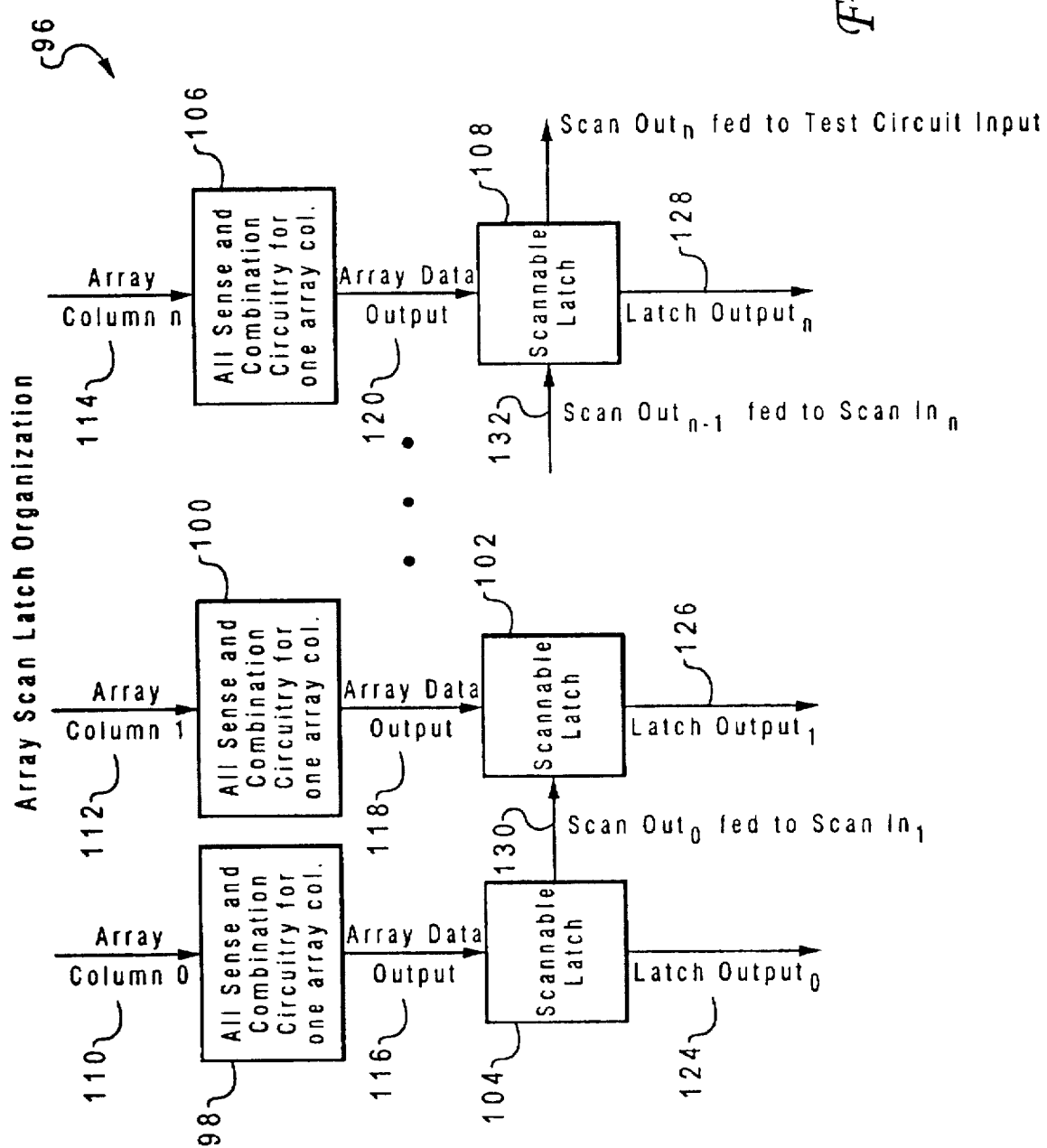
FIG. 4 illustrates a block diagram of an array scan latch organization in accordance with the apparatus of the present invention.

FIG. 4 illustrates a block diagram of an array scan latch organization 96 in accordance with the apparatus of the present invention. The array scan latch organization of FIG. 4 includes multiple scannable latch circuits which are coupled to one another. As depicted at block 98, all sense and combination circuitry for one column of an array is coupled to an array data output 116 which, in turn, is coupled to a scannable latch circuit as depicted at block 104. As depicted at block 100, all sense and combination circuitry for one array column is coupled to an array data output 118 which, in turn, is coupled to a scannable latch circuit 102. Column 0 of an array is input to the sense and combination circuitry for that particular array column, as depicted at line 110. Column 1 of an array is input to the sense and combination circuitry for that particular array column, as depicted at line 112.

As depicted at line 130, scan output from the scannable latch circuit depicted at block 104 is fed to the scannable latch circuit depicted at block 102. Latch output of column 0 is depicted at line 124. Latch output of column 1 is depicted at line 126. The pattern is repeated "n" number of times such that column n of the array scan latch organization 96 includes a column n input as depicted at line 114 and sense and combination circuitry for array column n as depicted at block 106. Array data output is included as depicted at line 120 which is also input to a scannable latch circuit as depicted at block 108. Latch output of column n is depicted at line 128 and scan output n−1 is read to scan input n as depicted at line 132 (i.e., analogous to the scan output of column 0 fed to scan input of column 1 as depicted at line 130).

When the requirements for minimum circuit area, maximum circuit performance, and testable design are combined for high-speed array design, the application of innovative circuit implementation can substantially improve the ability of the circuit designer to meet all criteria. The invention described herein addresses these tradeoffs by introducing a circuit that is a hybrid of a latch and NAND gate. This novel circuit can be shown to meet the requirements placed on the design by the conflicting priorities of test functionability and high-performance standard read functionality.

In FIG. 5(a), like parts are indicated by like numbers. FIG. 5(a) depicts a scannable dynamic latch circuit 140 with bitline NAND functionality in accordance with the apparatus of the present invention. Scannable dynamic latch circuit 140 described herein is an improvement on a standard dynamic latch designs. The integration of a NAND gate into the front end 142 of scannable dynamic latch circuit 140 has the benefit of reducing the number of transistors used to implement the necessary functions for array output. The NAND gate is formed from p-type transistors 146, 148, 150, and 152 wherein each gate of each respective transistor receives a bitline input. Output from the NAND gate is taken from the drain of each respective p-type transistor in the NAND gate configuration. NAND output 151 is coupled to each drain of the P-type transistors which comprise the NAND circuit. Scannable dynamic latch circuit 140 includes an N-type transistor 164 having its source coupled to the source of N-type transistor 166. In addition, the source of N-type transistor 164 and the source of N-type transistor 166 are tied to the drain of N-type transistor 162. The drain of N-type transistor 164 and the drain of N-type transistor 166 are coupled to ground 251. N-type transistor 164 is a first N-type transistor of scannable dynamic latch circuit 140. N-type transistor 166 is a second N-type transistor of scannable dynamic latch circuit 140.

Latch clock 212 is coupled to the gate of N-type transistor 164. The drain of N-type transistor 164 and the drain of N-type transistor 166 are tied to ground 251. N-type transistor 162 is coupled at its gate to bitline D 214, and at its source to the drain of N-type transistor 160. The gate of N-type transistor 162 is also coupled to the gate of P-type transistor 152. The gate of N-type transistor 160 is coupled to bitline C 160 and the gate of P-type transistor 150. The source of N-type transistor 160 is coupled to the drain of N-type transistor 158.

The gate of N-type transistor 158 is coupled to bitline B 218 and to the gate of P-type transistor 148. The source of N-type transistor 158 is coupled to the drain of N-type transistor 156. The gate of N-type transistor 156 is coupled to bitline A 220 and to the gate of P-type transistor 146. The source of N-type transistor 156 is coupled to the drain of P-type transistor 148. The drains of P-type transistors 146, 148, 150, and 152 are coupled to one another and to the drain of P-type transistor 169, the input to inverter 240, latch output 184, the gate of P-type transistor 174, and the gate of N-type transistor 180. The drain of N-type transistor 180 is coupled to ground 251. The source of P-type transistors 146, 148, 150, and 152 are coupled to power supply 250. The source of P-type transistor 174 is also coupled to power supply 250. Latch Clock# 170 is coupled to the gate of P-type transistor 168. P-type transistor 168 includes a source connected to power supply 250 and a drain tied to the drain of P-type transistor 169. Latch output 184 is a first latch output of scannable dynamic latch circuit 140. P-type transistor 168 is a first P-type transistor of scannable dynamic latch circuit 140. P-type transistor 169 is a second P-type transistor of scannable dynamic latch circuit 140. Inverter 240 is a first inverter of scannable dynamic latch circuit 140.

Latch Clock# 212 is coupled to the gate of P-type transistor 178. The source of P-type transistor 178 is coupled to power supply 250 and the drain to the source of P-type transistor 169. The gate of P-type transistor 169 is coupled to the drain of N-type transistor 176 and P-type transistor 178. The gate of P-type transistor 169 is also tied to bitline D 214 and the gate of N-type transistor 162. Scan Clock 1# 172 is tied to the gate of N-type transistor 176. Scan Clock 1 244 is tied to the gate of P-type transistor 178 and to the gate of N-type transistor 165. Scan Clock 1# 210 is tied to the gate of P-type transistor 167 whose drain is coupled to the output of inverter 191 and the drain of N-type transistor 165. The source of P-type transistor 167 is coupled to the source of N-type transistor 165. The input of inverter 191 is coupled to Scan In 208. Inverter 191 is a second inverter of scannable dynamic latch circuit 140.

Scan Clock 1# 172 is a first scan clock of scannable dynamic latch circuit 140. Scan Clock 1# 210 is also a first scan clock of scannable dynamic latch circuit 140. Scan Clock 1 244 is a second scan clock of scannable dynamic latch circuit 140. N-type transistor 165 is a fourth N-type transistor of scannable dynamic latch circuit 140. P-type transistor 178 is a third P-type transistor of scannable dynamic latch circuit 140. P-type transistor 167 is a fifth P-type transistor of scannable dynamic latch circuit 140.

The source of P-type transistor 178 is also coupled to the drain of N-type transistor 192 and the drain of P-type transistor 190. The gate of P-type transistor 190 is coupled to Scan Clock 2# 206 and to the gate of N-type transistor 196. The drain of N-type transistor 196 is coupled to ground 251. The source of N-type transistor 196 is coupled to the drain of N-type transistor 198. The gate of N-type transistor 198 is connected to the output of inverter 231 and to the gate of P-type transistor 200. The source of N-type transistor 198 is coupled to the input to inverter 231 and to the drain of P-type transistor 200. The drain of P-type transistor 200 is also coupled to the source of N-type transistor 192 and the source of P-type transistor 190. The gate of N-type transistor 192 is coupled to Scan Clock 2 186 and to the gate of P-type transistor 188.

The source of N-type transistor 192 is also coupled to the input of inverter 202 which in turn is coupled to Scan Out 204. The source of P-type transistor 188 is coupled to power supply 250. The drain of P-type transistor 169 is also connected to the input to inverter 240 which in turn is coupled to Latch Output# 182. The input to inverter 240 is also coupled to Latch Output 184 and the gate of N-type transistor 180. N-type transistor 192 is an eighth N-type transistor of scannable dynamic latch circuit 140. P-type transistor 190 is an eighth P-type transistor of scannable dynamic latch circuit 140. N-type transistor 196 is a seventh N-type transistor of scannable dynamic latch circuit 140. Scan Clock 2 186 is a third scan clock of scannable dynamic latch circuit 140. Scan Clock 2# 206 is a fourth scan clock of scannable dynamic latch circuit 140. N-type transistor 198 is a sixth scan clock of scannable dynamic latch circuit 140. P-type transistor 200 is a seventh P-type transistor of scannable dynamic latch circuit 140. Inverter 202 is a fourth inverter of scannable dynamic latch circuit 140. P-type transistor 188 is a sixth P-type transistor of scannable dynamic latch circuit 140. Latch Output# 182 is a second latch output of scannable dynamic latch circuit 140. Latch Output# 184 is a first latch output of scannable dynamic latch circuit 140.

The operation of scannable dynamic latch circuit 140 can be described by considering the precharge and evaluate phases separately. During precharge, all four bitlines— bitline A 220, bitline B 218, bitline C 216, and bitline D 214—are charged to a precharge high condition. In addition, the latch clock for the scannable dynamic latch circuit 140 is inactive, forcing the invert of the latch clock (i.e., Latch Clock# 212) to be high. Based on these two situations, the output of scannable dynamic latch circuit 140 will be precharged low during this precharge phase. When scannable dynamic latch circuit 140 enters its evaluate phase, the signal Latch Clock# 212 will transition to an inactive low state. A "low" state will be maintained on the output of the scannable dynamic latch circuit 140 due to the pull-down transition to an inactive low state. A "low" state will be maintained on the output of the scannable dynamic latch circuit 140 due to N-type transistor 166 which acts as a pull-down device. The gate of N-type transistor 166 is connected to a high level through an inverter circuit formed by P-type transistor 174/N-type transistor 180, and the pass gate formed by N-type transistor 176/P-type transistor 178. P-type transistor 174 is a fourth P-type transistor of scannable dynamic latch circuit 140. N-type transistor 180 is a fifth N-type transistor of scannable dynamic latch circuit 140.

If an SRAM cell in the array causes any bitline to become discharged through a read operation, then the output of scannable dynamic latch circuit 140 will transition to an active high level. For example, if bitline A 220 discharges during an array read operation, then the gate of N-type transistor 156 will transition low, deactivating that particular device. In addition, the gate of P-type transistor 146 will go low, turning on that particular device. The result is that this bitline transition will cause the output of the latch to transition from low to high. This output result will be held until all four bitlines precharge high and until the precharge clock activates N-type transistor 164.

In order for scannable dynamic latch circuit 140 to be scannable, scannable dynamic latch circuit 140 must have circuitry present that will disable the standard read path and enable a special scan path. In this scannable dynamic latch circuit 140, the signal Latch Clock# 212 will be disabled during scan operation such that the signal is always at a low logic level. In addition, the signals Scan Clock 1 244 and Scan Clock 1# 210 will be used to clock in data from an adjacent latch. Finally, the signals Scan Clock 2 186 and Scan Clock 2# 206 are utilized to pass internal data in scannable dynamic latch circuit 140 to the scan output of scannable dynamic latch circuit 140 so that the next scannable latch in the chain may receive it. It should be noted that the aforementioned scan clocks can disable feedback sections of scannable dynamic latch circuit 140.

Figure 5B:
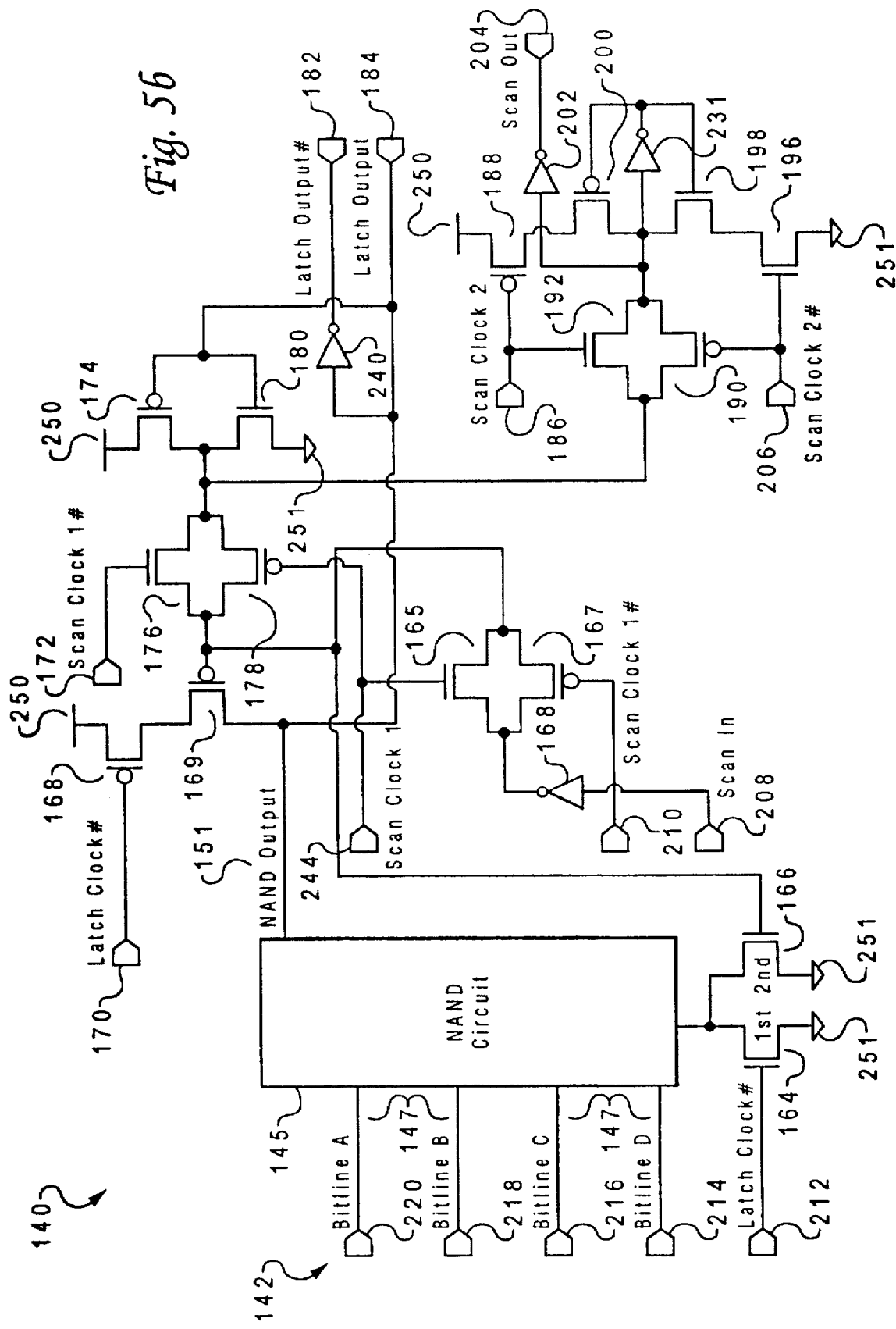
FIG. 5(b) illustrates a scannable dynamic latch circuit with bitline NAND functionality in block diagram format in accordance with the apparatus of the present invention.

FIG. 5(b) depicts a scannable dynamic latch circuit with bitline NAND functionality in block diagram format in accordance with the apparatus of the present invention. In FIG. 5(a) and FIG. 5(b) like parts are indicated by like numbers. NAND circuit 145 includes a NAND output 151 coupled to the drain of P-type transistor 169. The front end 142 of scannable dynamic latch circuit 140 is coupled to NAND input 147.

The invention described herein allows a dynamic latch function to be integrated into bitline summation circuits in a high-performance SRAM array. By utilizing this circuit, the best overall combination of key criteria is realized: minimum size, minimum delay, and proper testability (i.e., scannability). While the invention has been particularly shown as described with reference to a preferred embodiment, it will be understood by those skilled in the art that various changes in form and detail may be made therein without departing from the spirit and scope of the invention.

What is claimed is:

1. A dynamic scannable latch circuit for high-speed memory arrays utilized in high-performance integrated circuit devices, wherein said high-speed memory arrays include data-bearing bitlines, comprising:

a plurality of scannable latch circuits for serially reading data from high-speed memory arrays during memory-testing cycles wherein at least one of said plurality of scannable latch circuits provides a scan output to a scan input of a second scannable latch circuit; and a plurality of sensing and combination circuits for sensing the presence of said data-bearing bitlines and for combining said data-bearing bitlines into a memory array output wherein at least one sensing and combination circuit among said plurality of sensing and combination circuits is coupled to each scannable latch circuit among said plurality of scannable latch circuits.

2. The dynamic scannable latch circuit of claim 1 wherein said plurality of sensing and combination circuits further comprises:

a plurality of NAND circuits integrated into a front end of said dynamic scannable latch circuit, wherein each NAND circuit among said plurality of NAND circuits includes NAND inputs and a NAND output, wherein said NAND output is coupled to one of said scannable latch circuits.

3. The dynamic scannable latch circuit of claim 2 wherein said data-bearing bitlines are coupled to said inputs of said at least one NAND circuit.

4. The dynamic scannable latch circuit of claim 3 wherein said data-bearing bitlines comprise at least four bitlines.

5. The dynamic scannable latch circuit of claim 4 wherein said plurality of scannable latch circuits further comprises:

a latch clock coupled to a gate of a first N-type transistor, said first N-type transistor having a source coupled to said NAND circuit and to a source of a second N-type transistor;

said first N-type transistor and said second N-type transistor each having a drain coupled to ground;

said latch clock coupled to a gate of a first P-type transistor wherein said first P-type transistor includes a source coupled to a power supply and a drain coupled to a source of a second P-type transistor, said second P-type transistor having a drain coupled to a first latch output and to an input of a first inverter wherein said first inverter includes an output coupled to a second latch output;

a first scan clock connected to a gate of a third N-type transistor wherein said third N-type transistor includes a drain coupled to a gate of said second P-type transistor and to said gate of said second N-type transistor and to a drain of a third P-type transistor;

a second scan clock coupled to a gate of said third P-type transistor and to a gate of a fourth N-type transistor;

said first scan clock further coupled to a gate of a fifth P-type transistor;

a scan input coupled to an input of a second inverter, said second inverter having an output coupled to a drain of said fourth N-type transistor and to a drain of said fifth P-type transistor;

said fifth P-type transistor having a source coupled to a source of said fourth N-type transistor wherein each of said sources are coupled to said gate of said second N-type transistor;

said first latch output further coupled to a gate of a fourth P-type transistor and to a gate of a fifth N-type transistor wherein a source of said fourth P-type transistor is coupled to said power supply and a drain of said fifth N-type transistor is coupled to ground;

said drain of said fourth P-type transistor coupled to a source of said fifth N-type transistor wherein said drain and said source are tied to said source of said third N-type transistor and to said source of said third P-type transistor and to a drain of an eighth N-type transistor;

said drain of said eighth N-type transistor tied to a drain of an eighth P-type transistor wherein said eighth N-type transistor includes a gate coupled to a third scan clock and said eighth P-type transistor includes a gate coupled to a fourth scan clock, said fourth scan clock coupled to a gate of a seventh N-type transistor wherein said seventh N-type transistor includes a drain coupled to ground and a source coupled to a drain of a sixth N-type transistor;

said sixth N-type transistor including a gate coupled to an output of a third inverter wherein an input of said third inverter is coupled to a source of said sixth N-type transistor and to an input of a fourth inverter whose output is coupled to a scan output and to a drain of a seventh P-type transistor;

said drain of said seventh P-type transistor coupled to said source of said eighth N-type transistor and said source of said eighth P-type transistor;

a gate of said seventh P-type transistor coupled to said output of said third inverter; and a gate of said seventh P-type transistor coupled to a drain of said sixth P-type transistor wherein said sixth P-type transistor includes a source coupled to said power supply.

6. The dynamic scannable latch circuit of claim 5 wherein said NAND circuit further comprises:

four P-type transistors connected to one another in parallel wherein each of said P-type transistors include a source coupled to said power supply and a drain coupled to said NAND output and a gate;

four N-type transistors connected to one another in series wherein each of said N-type transistors include a gate respectively coupled to said gates of said four P-type transistors; and at least one source of said N-type transistors coupled to at least one drain of said P-type transistors.

* * * * *